(12) United States Patent
Fuderer

(10) Patent No.: US 7,208,949 B2
(45) Date of Patent: Apr. 24, 2007

(54) MAGNETIC RESONANCE METHOD WITH NON-LINEAR MAGNETIC FIELD GRADIENTS

(75) Inventor: Miha Fuderer, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 1 day.

(21) Appl. No.: 10/542,828

(22) PCT Filed: Dec. 15, 2003

(86) PCT No.: PCT/IB03/06306

§ 371 (c)(1),
(2), (4) Date: Jul. 20, 2005

(87) PCT Pub. No.: WO2004/065977

PCT Pub. Date: Aug. 5, 2004

(65) Prior Publication Data

US 2006/0061359 A1    Mar. 23, 2006

(30) Foreign Application Priority Data

Jan. 21, 2003  (EP) ................... 03100115

(51) Int. Cl.
*G01V 3/00* (2006.01)
(52) U.S. Cl. ...................... 324/309; 600/410
(58) Field of Classification Search ............... 324/307, 324/309
See application file for complete search history.

(56) References Cited

U.S. PATENT DOCUMENTS

| | | | |
|---|---|---|---|
| 4,651,098 A | 3/1987 | Yamada et al. | |
| 4,672,320 A | 6/1987 | Sekihara et al. | |
| 5,506,504 A | 4/1996 | Kienlin | |
| 5,886,524 A | 3/1999 | Krieg | |
| 5,935,065 A | 8/1999 | Rose et al. | |
| 6,252,401 B1 | 6/2001 | Werthner et al. | |
| 6,476,607 B1* | 11/2002 | Dannels et al. | ............. 324/309 |
| 6,487,435 B2* | 11/2002 | Mistretta et al. | ............. 600/420 |
| 6,556,009 B2* | 4/2003 | Kellman et al. | ............. 324/309 |

(Continued)

FOREIGN PATENT DOCUMENTS

WO    WO 00/33100 A1    6/2000

OTHER PUBLICATIONS

Lai, C-M.; Reconstructing NMR images from projections under inhomogeneous magnetic field and non-linear field gradients; 1983; Phys.Med.Biol.; 28:8:925-938.

(Continued)

*Primary Examiner*—Brij Shrivastav
*Assistant Examiner*—Dixomara Vargas

(57) ABSTRACT

A magnetic resonance imaging method is presented for forming an image of an object, wherein a stationary magnetic field and temporary magnetic fields having a position dependent field pattern are applied, magnetic resonance signals are acquired by at least one receiver antenna, spins are excitated in a part of the object, MR signals are acquired during application of the position-dependent field patterns (G1, G2, . . . ) and a magnetic resonance image is derived from the sampled magnetic resonance signals. The field patterns are substantially non-linear, the number N of total field patterns is larger than 3, and at least N−1 field patterns are independently controllable in field strength. The magnetic resonance signals are acquired in a sub-sampling fashion.

16 Claims, 5 Drawing Sheets

U.S. PATENT DOCUMENTS

| | | |
|---|---|---|
| 6,870,368 B2 * | 3/2005 | Visser et al. ............... 324/318 |
| 6,969,991 B2 * | 11/2005 | Bammer et al. ............ 324/307 |
| 2002/0147395 A1 * | 10/2002 | Heid ........................ 600/410 |
| 2006/0058630 A1 * | 3/2006 | Harvey ..................... 600/410 |

OTHER PUBLICATIONS

Oh, C.H., et al.; New Spacial Localization Method Using Pulsed High-Order Field Gradients; 1991; MRM; 18:63-70.

Pruessmann, K.P., et al.; Coil Sensitivity Encoding for Fast MRI; 1998; ISMRM abstracts 579.

Pruessmann, K.P., et al.; Coil Sensitivity Maps for Sensitivity Encoding and Intensity Correction; 1998; ISMRM abstracts 2087.

Pruessmann, K.P., et al.; SENSE: Sensitivity Encoding for Fast MRI; 1999; MRM; 42:952-962.

Weiger, M., et al.; Cardiac Real-Time Acquisition Using Coil Sensitivity Encoding; 1998; ISMRM abstracts 803.

Weiger, M., et al.; Accellerated Cardiac Breathhold Imaging Using Coil Sensitivity Encoding; 1998; ISMRM abstracts 799.

* cited by examiner

MAGNETIC RESONANCE METHOD WITH NON-LINEAR MAGNETIC FIELD GRADIENTS

BACKGROUND

The invention relates to a magnetic resonance (MR) method for the imaging of an object arranged in a steady magnetic field, whereas the following steps being executed according to said method:
applying of a stationary magnetic field and temporary magnetic position-dependent field patterns,
excitation of spins in a part of the object,
acquiring magnetic resonance signals by one or more receiver antennae,
and MR signals are acquired during application of the position-dependent field patterns.

The invention also relates to an MR device for carrying out such a method.

Current MR systems are usually very limited in size of the useable imaging region which is dependent on the homogeneity volume of the main stationary magnetic field. In this volume the main magnetic field has to obey stringent aims on constancy and the three temporary magnetic gradient fields have to obey stringent aims with respect to linearity. Increasing the volume of the main magnetic field, where the field is substantially constant and the normal gradients are substantially linear, makes the system extremely expensive.

SUMMARY

It is thus an object of the present invention to obtain an MR imaging system which is less dependent on the homogeneity of the main magnetic field and of the linearity of the gradient fields.

One advantage of the present invention is that the method allows the use of any position-dependent field pattern, which is substantially non-linear, so that subsampling method like SENSE can also be applied for a MR systems with imperfect coils.

BRIEF DESCRIPTION OF THE DRAWINGS

These and other advantages of the invention are disclosed in the dependent claims and in the following description in which an exemplified embodiment of the invention is described with respect to the accompanying drawings. Therein shows:

DETAILED DESCRIPTION

Figure 1:
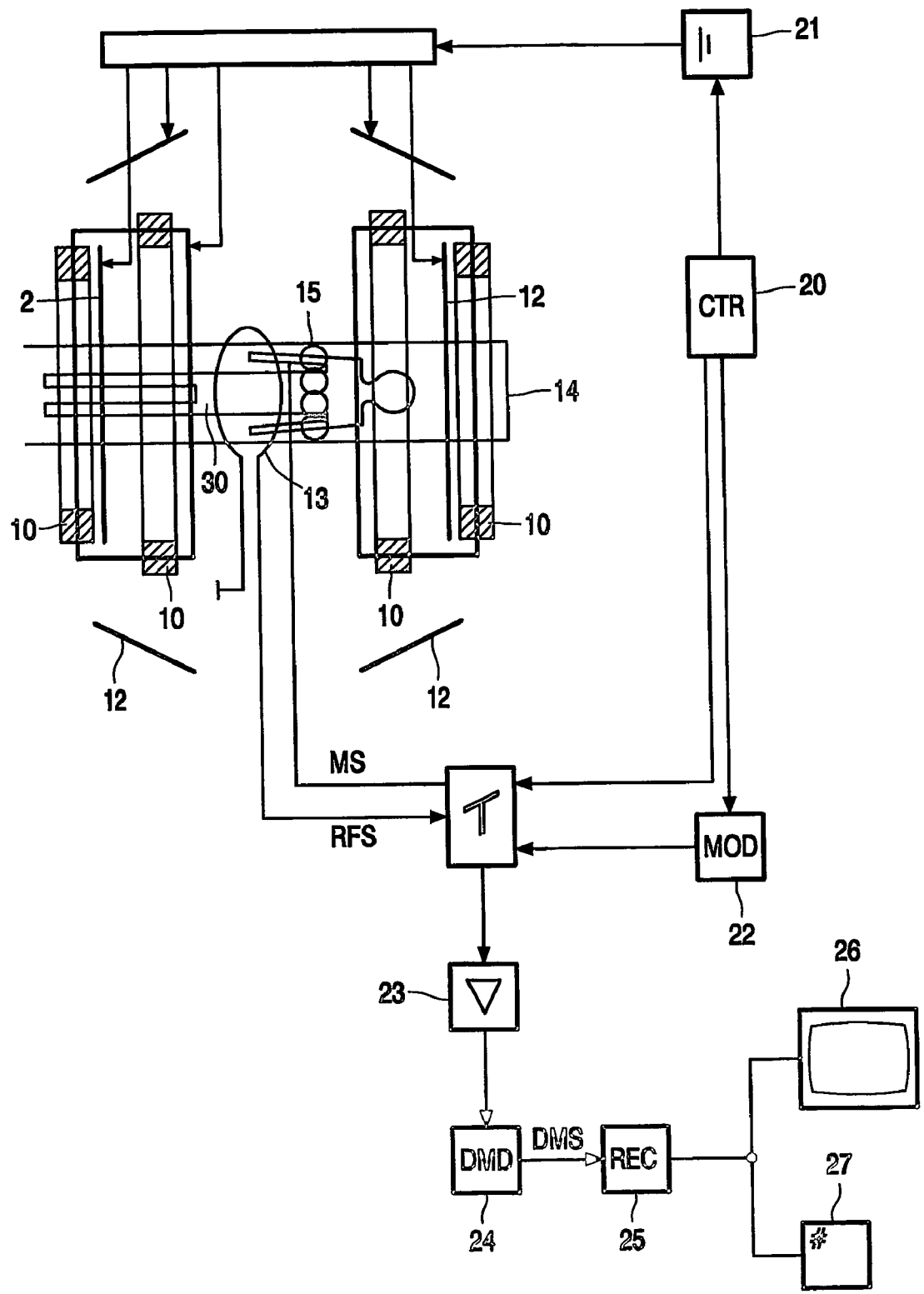
FIG. 1 diagrammatically illustrates a magnetic resonance imaging system.

FIG. 1 shows diagrammatically a magnetic resonance imaging system in which the invention is used. The magnetic resonance imaging system includes a set of main coils 10 whereby the steady, uniform magnetic field $B_0$ is generated. The main coils are constructed, for example in such a manner that they enclose a tunnel-shaped examination space. The patient to be examined is slid into this tunnel-shaped examination space. The magnetic resonance imaging system also includes a number of field pattern coils 11, 12 whereby magnetic fields exhibiting spatial variations, notably in the form of temporary position-dependent field patterns in individual directions, are generated so as to be superimposed on the uniform magnetic field. The field pattern coils 11, 12 are connected to a controllable power supply 21. The field pattern coils 11, 12 are energized by application of an electric current by means of the power supply unit 21. The strength, direction and duration of the field patterns are controlled by control of the power supply unit. The magnetic resonance imaging system also includes transmission and receiving coils 13, 15 for generating the RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of RF excitation pulses and RF refocusing pulses. Preferably, the body coil 13 involves a spatially uniform intensity distribution of the transmitted RF pulses. The receiving coils 15 are preferably surface coils 15 which are arranged on or near the body of the patient 30 to be examined. Such surface coils 15 have a high sensitivity for the reception of magnetic resonance signals which is also spatially inhomogeneous. This means that individual surface coils 15 are mainly sensitive for magnetic resonance signals originating from separate directions, i.e. from separate parts in space of the body of the patient to be examined. The coil sensitivity profile represents the spatial sensitivity of the set of surface coils. The receiving coils, notably surface coils, are connected to a demodulator 24 and the received magnetic resonance signals (MS) are demodulated by means of the demodulator 24. The demodulated magnetic resonance signals (DMS) are applied to a reconstruction unit 25. The reconstruction unit reconstructs the magnetic resonance image from the demodulated magnetic resonance signals (DMS), on the basis of the coil sensitivity profile and the knowledge of the fields of the temporary field patterns of the set of surface coils. The coil sensitivity profile is stored, for example electronically, in a memory unit which is included in the reconstruction unit. The reconstruction unit derives one or more image signals from the demodulated magnetic resonance signals (DMS), which image signals represent one or more, possibly successive magnetic resonance images. The reconstruction unit 25 in practice is preferably constructed as a digital image processing unit 25 which is programmed so as to reconstruct the magnetic resonance image from the demodulated magnetic resonance signals and on the basis of the coil sensitivity profiles and the knowledge of the fields of the temporary field patterns. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the position-dependent field patterns. Subsequently, the transmission coils apply the RF excitation pulse to the examination space in which the part to be imaged of the patient to be examined is situated. The RF excitation pulse excites the spins in the region of interest, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which part is much larger than a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals.

In contradistinction to a conventional MR imaging system as described in principle above the MR imaging system according to the present invention contains N subsystems that can induce purposely and substantially position-dependent field patterns. The expression "field pattern" is meant to be in more general terms for what is conventionally mentioned "gradient" or "main field" which are normally linear and homogeneous. The field patterns used in this invention are substantially non-linear. A further important feature of the method is that the number N of field patterns is always larger than 3. In addition, at least N–1 field patterns are independently controllable in their field strength, i.e. the strength of the created pattern is controlled by the current applied to the particular subsystem, which is called here "switchable".

In the sequel, these field patterns are called $G_0(x, y, z)$, $G_1(x, y, z)$, $G_2(x, y, z)$, ..., $G_{N-1}(x, y, z)$, or for simplicity $G_0, G_0, G_1, G_2, \ldots, G_{N-1}$. All of them are switchable, except the main field pattern $G_0$ which is comparable with the main field $B_0$ in a conventional MR system. A conventional MR system may be regarded as one where $G_1(x, y, z)=G_x(x, y, z)=x, \ldots, G_3(x, y, z)=G_z(x, y, z)=z$ and there is no other purposely position-dependent field.

The acquisition of data on such a system is performed by using any known MR method as described above in connection with FIG. 1, whereas $G_1$, $G_2$, $G_3$, $G_4$, .... are switched as in "normal" MR acquisition systems for $G_x$, $G_y$ and $G_z$. As a main difference, this is an experiment of higher dimensionality, e.g. using four encoding dimensions to acquire information from a three-dimensional human body. In order to compensate for this gross increase in scanning time as more data must be sampled, a further important characteristic of the present method is that the acquired data is grossly undersampled in analogy to the well-known SENSE technique (see e.g. K. Pruessmann et. al. in Proc. ISMRM, 1998, abstracts pp. 579, 799, 803 and 2087).

Figure 4:
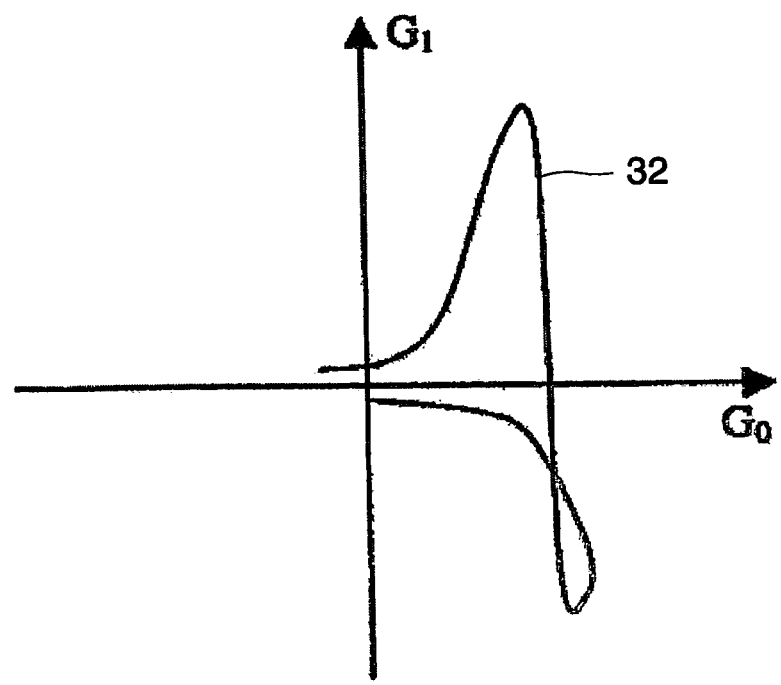
FIG. 4 illustrates the locus of the object-space in G-space.

The reconstruction is formed by following elements:

1. The knowledge of the mapping of co-ordinates (x, y, z) in real space to G-space. For better understanding of this notion suppose that each of the subsystems is driven by a unit current (e.g. 1A), and, if applicable the steady-state subsystem $G_0$ is driven by its standard current. Then every point in real space will experience a given field component caused by the system $G_0$, some other field component caused by the system $G_1$, etc. Thus any specific point (x, y, z) will be mapped to a point $(g_0, g_1, g_2, \ldots, g_{N-1})$ in G-space, as is depicted in FIG. 4. The mapping is, in principle, known from the system design.
2. The acquired raw MR-data can be seen as an N-dimensional set of data in the $(k_0, k_1, k_2, \ldots, k_{N-1})$-space in analogy to $(k_x, k_y, k_z)$. That data can be transformed by Fourier transformation to G-space (cf "image space").
3. Some pairs of (x, y, z) locations will map to identical $(g_0, g_1, g_2, \ldots, g_{N-1})$—co-ordinates due to folding. These ambiguities can be resolved by knowledge of the coil-sensitivity profiles which technique is known from SENSE, or by continuity constraints or by known sparsity of the object, e.g. when vessels are imaged.

Figure 2:
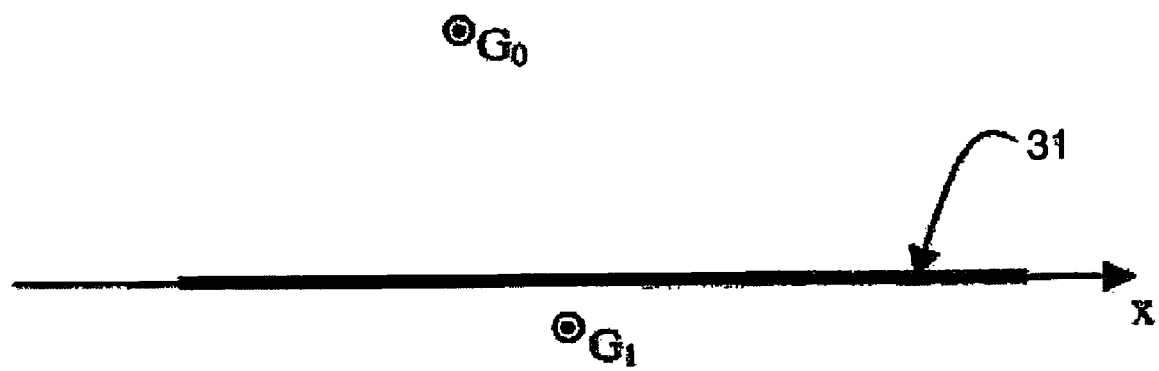
FIG. 2 depicts a one-dimensional object acquired with two field-patterns.
Figure 3:
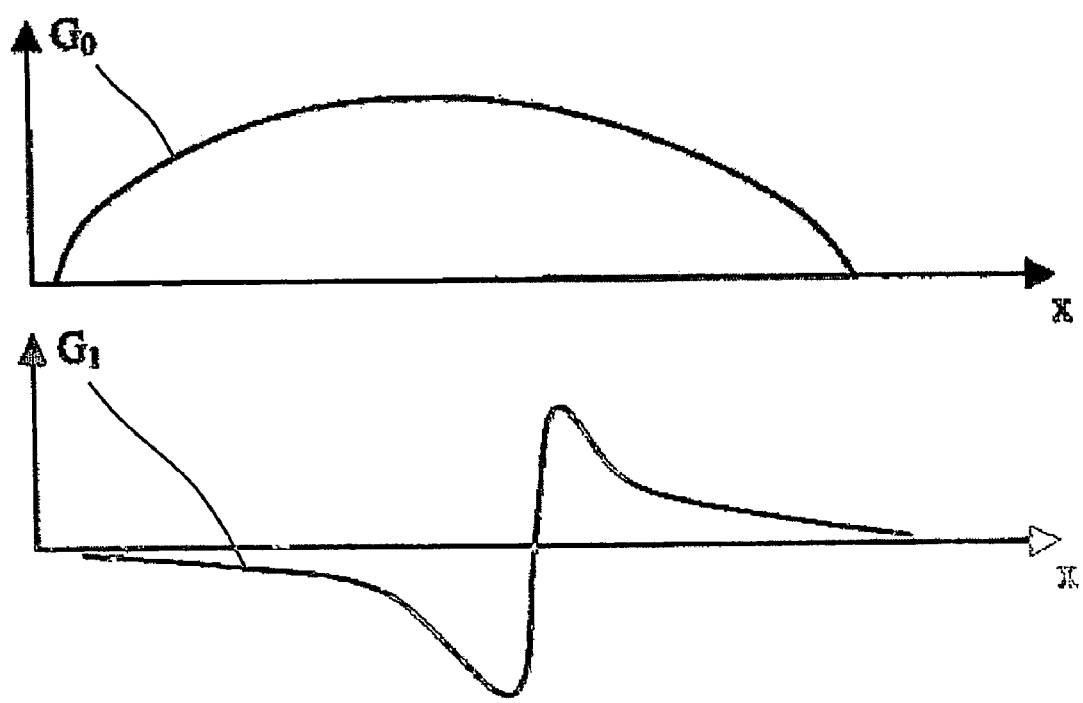
FIG. 3 illustrates an x-component of the field caused by the two field patterns.

For better understanding of the present method consider now the simplified case of an MR imaging system designed to image an object in only one dimension. The imaging system is depicted in FIG. 2 wherein $G_0$ is a circular coil system and $G_1$ is a straight lead that is close to the one-dimensional object 31, i.e. (part of) the patient. It is further assumed that a strong constant field is present, aligned with the main direction of the object 31. In FIG. 3 the field strength B of both field patterns $G_0$ and $G_1$ are depicted with respect to the x-axis. Given these field patterns, one can draw the locus 32 of the one-dimensional object in the two-dimensional G-space as shown in FIG. 4.

Figure 5:
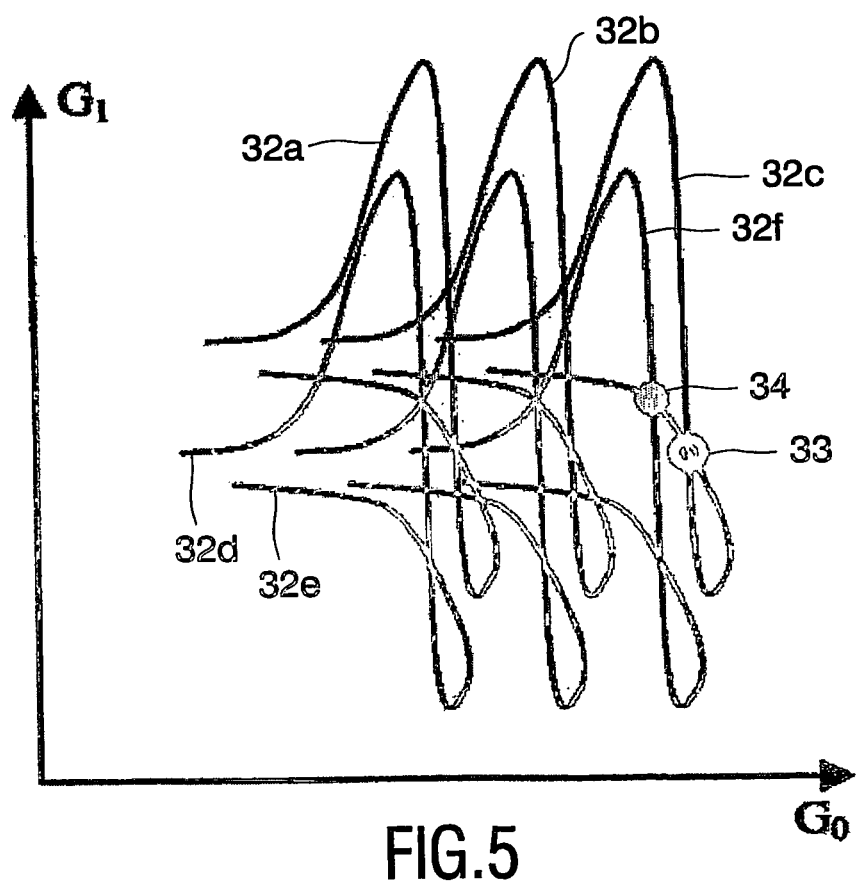
FIG. 5 illustrates folding of the object-locus in G-space due to undersampling.

In principle on this system a normal 2-dimensional MR experiment can be applied, whereas the current in $G_0$ will be driven as a readout field pattern and the current in $G_1$ as a phase-encoding field pattern. After Fourier transformation a 2-dimensional image will be obtained, of which only a small part would be nonzero, i.e. the locus of the object 31. However, such a simple approach would have the significant drawback of a gross increase in scanning time. In above example $256^2$ measurements points are needed to resolve approximately 256 points of the patient. In order to overcome this disadvantage, a gross subsampling of G-space can be applied. The result can nevertheless be reconstructed, as large areas of G-space are factually empty. In FIG. 5 the folding of the locus 32a, 32b, ..., 32f of object 31 in G-space due to undersampling is shown. Large parts of the object 31 can be uniquely extracted from G-space, but on some points there may be an overlap. This can be intrinsic as shown at circle 33 or caused by undersampling as shown at full bullet 34. The intrinsic ambiguity may be caused by system design (e.g. due to current lead constraints, two points of the object have exactly the same magnetic field under all circumstances etc.). However, it is more likely that the ambiguity is caused by undersampling. Both ambiguities can be resolved in several manners. The first one is to apply the knowledge on coil sensitivity patterns, if the object has been acquired using an array of coils—like in the SENSE method mentioned above. A second solutions is the use of continuity constraints e.g. by assuming that is unlikely that an object will show a distinct local detail at exactly a particular cross-over position. Especially if such a system is used for angiographic purposes, the knowledge can be used that large parts of the interesting object will contain only very little signal at all.

Figure 6:
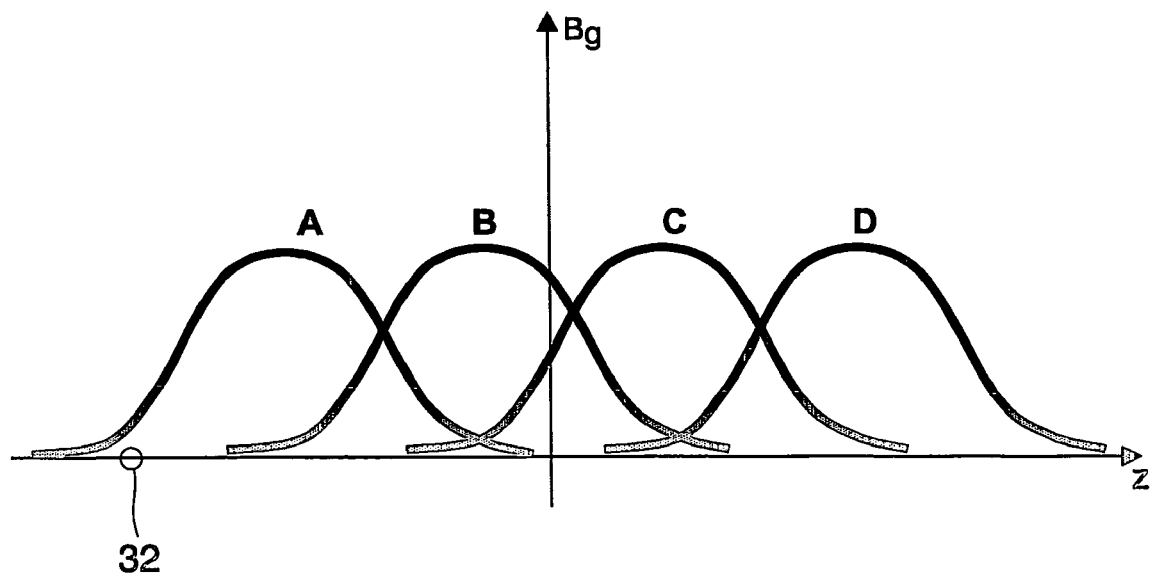
FIG. 6 illustrates exemplary position dependent field patterns of four conductor systems.
Figure 7:
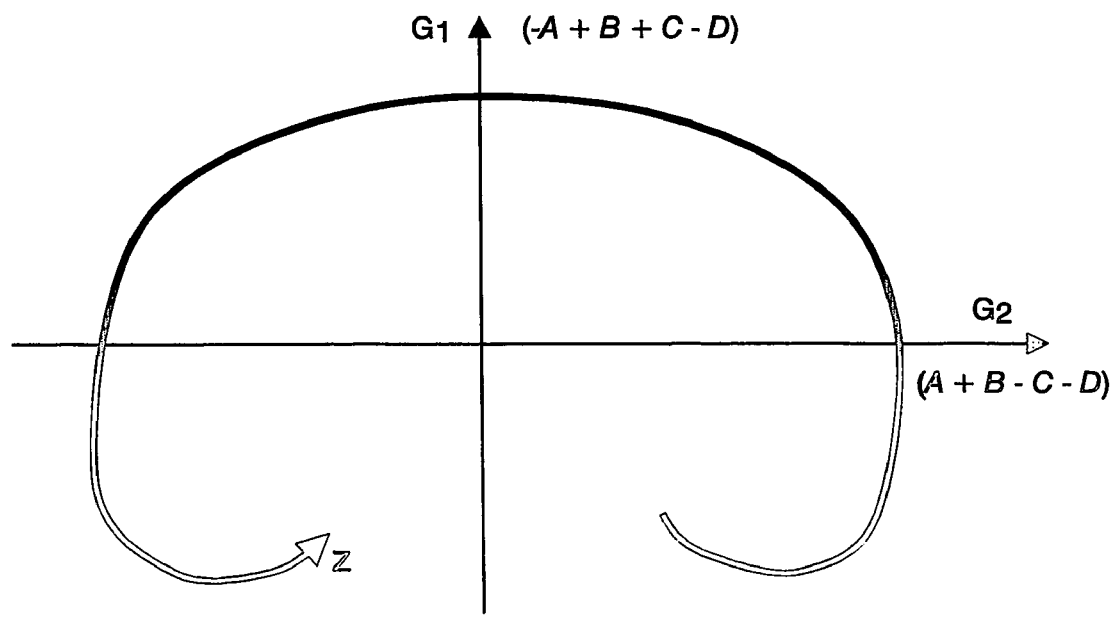
FIG. 7 illustrates an exemplary locus of the object in G-space.
Figure 8:
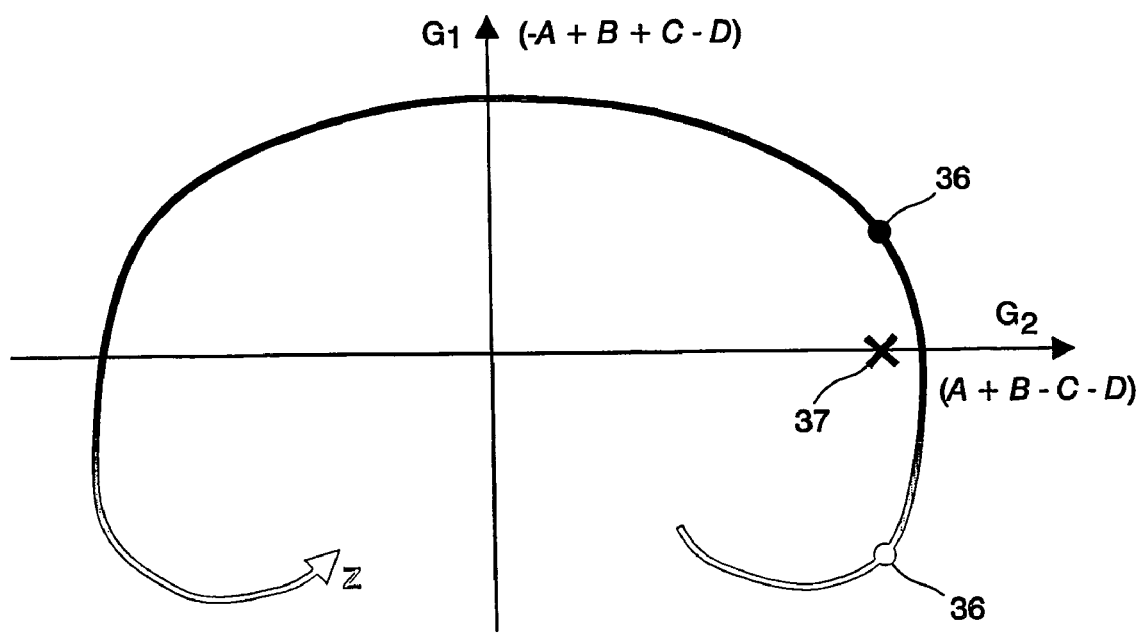
FIG. 8 illustrates the same locus as in FIG. 7 with a single measurement point.
Figure 9:
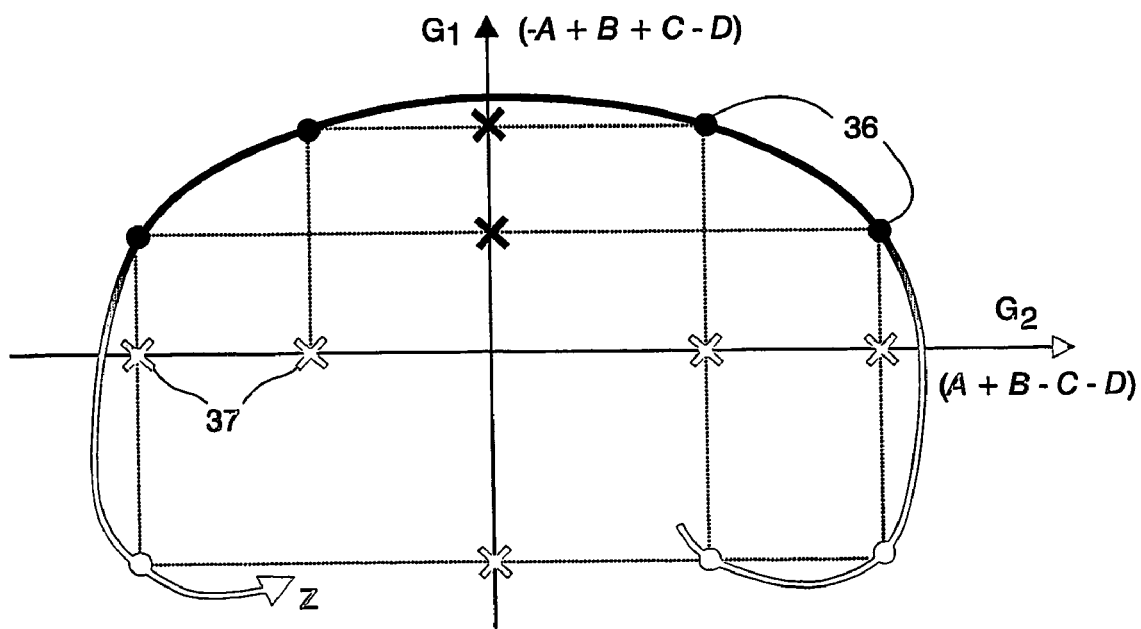
FIG. 9 illustrates the same locus as in FIG. 7 with several measurement points.

This more theoretical approach can be understood better by way of the following model as depicted in FIG. 6. If a more or less linear field pattern system in direction "feet-head" (z-direction) would be used like e.g. the open magnet system as shown and described in FIG. 4 of WO-A-00/33100, the field pattern system must store a huge amount of energy which only can be arranged by very expensive electric amplifiers, which imply very strong field variations at about 1 meter off the centre of the MR system. Therefore, nervous stimulation will occur with the patient and the operator. It should be clear that such large fields with high energy storage will make the practical use of linear field patterns in z-direction almost impossible. An alternative to a linear field pattern in z-direction can be obtained by a system of parallel conductor systems, e.g. the four systems A, B, C and D, each of which has a design similar as the main magnet field of the system as shown in FIG. 2 of WO-A-00/33100, whereas the "switched" magnetic fields are substantially shorter in z-direction. The four conductor systems A, B, C and D are identical, but provided equidistantly at different positions along the z-axis. Each of the conductor systems A, B, C and D can be controlled separately. The field pattern of each of the conductor systems is shown in FIG. 6, whereas $B_{gs}$ is the extra field "switched" by the conductor system at a unit of current. Since the field pattern of the conductor systems is a Gaussian function and thus not linear in z-direction, it is definitely not a "gradient" as known from the usual MR systems. However, the conductor systems can be used similar as "gradients" in the classical manner since they have a pattern which varies continuously in z-direction and can be switched on and off. It is now possible to perform two different MR sequences in z-direction, whereas in x- and y-direction normal gradients are used. The first sequence the combination $G_1=(A+B-C-D)$ is applied and the second sequence the combination $G_2=(-A+B+C-D)$ is applied. For each of the sequence the data received by the receiver antennae will be reconstructed in a normal manner, e.g. according to a 3-dimensional Fast Fourier Transformation (FFT). For each of the (x, y) coordinate of the patient a graph in $G_1$–$G_2$ space according to FIG. 7 will be obtained which is commensurate to a straight line parallel to the z-axis. Concerning the axis $G_1$ and $G_2$ one should realise that it represents the magnetic field of the combination of coils or conductor systems A, B, C and D excited by a unit of electric current. So, the first MR sequence is measuring the equidistant points along this axis (for all x and y coordinates of that point along the z-axis). The curve in FIG. 7 is the locus of all combinations which are possible within the patient's body. For instance, the point at the far left of the patient (circle 35 in FIG. 6) which is almost only excited by conductor system A, experiences a negative magnetic field for $G_2$ and a positive magnetic field for $G_1$. The results of the mentioned measuring sequences represent in fact a projection of the patient curve on the axis. Thus, the measurement of point 36 ("X") at the $G_1$ axis is a sum of images within the patient at two different positions 37 ("full bullets"), as can be seen in FIG. 8. The two points can be derived from the measurement points 36 by knowledge of the sensitivity of the RF coils in analogy to the SENSE method. Since the number of measured points on the curve is essentially identical to the number of unknown variables, the calculation should be performed with all other measured variables. In the example showed in FIG. 7 the number of measurement points 37 ("fill bullets") is seven and also the number of unknown variables 36 ("X") is seven—see FIG. 9.

With the system described above one can design an MR system with imperfect coils having highly non-linear field patterns—comparable with "gradients" in classical terms—in order to obtain a relatively inexpensive system of large field-of-view. Important prerequisites for such a system are that the position-dependent field patterns and the coil sensitivity patterns, i.e. the proper features of the RF coil system, should be known.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging method for forming an image of an object, wherein
a stationary magnetic field and temporary magnetic fields having a position dependent field pattern are applied,
magnetic resonance signals are acquired by at least one receiver antenna,
spins are excited in a part of the object,
MR signals are acquired in a sub-sampling fashion during application of the position-dependent field patterns, the magnetic resonance signals being sub-sampled by means of an array of receiving antennae,
a magnetic resonance image is derived from the sub-sampled magnetic resonance signals, the magnetic resonance image being derived from the sub-sampled magnetic resonance signals on the basis of the spatial sensitivity profiles of the array of receiving antennae, and
the position dependent field patterns are substantially non-linear, the number N of total field patterns is larger than 3, and at least N−1 field patterns are independently controllable in field strength.

2. The method as claimed in claim 1, wherein fold-over artifacts are distinguished by continuity constraints of the object to be imaged.

3. The method as claimed in claim 1, wherein fold-over artifacts are distinguished and discarded by knowledge of the sparsity of the object to be imaged.

4. The method according to claim 1, wherein the position dependent field patterns include oscillating field patterns.

5. The method according to claim 1, wherein the position dependent field patterns are encoded in at least four dimensions to acquire image information from a three-dimensional object.

6. The method according to claim 1, wherein the excitation of spins and acquisition of MR signals is repeated during each repetition, temporary magnetic field components with non-linear spatial position field patterns are applied along three axes, a spatial dependency of the field patterns applied along at least one of the axes being different in subsequent repetitions.

7. A computer medium or processor programmed to perform the method according to claim 1.

8. A computer program product stored on a computer usable medium for forming an image comprising a computer readable program means for causing a computer to control the execution of:
applying a stationary magnetic field and temporary magnetic fields having position dependent field patterns relative to 3 spatial dimensions, the magnetic fields being substantially non-linear and a number N of total field patterns being larger than 3, field patterns with different position dependencies relative to at least one of the dimensions being applied in subsequent data excitement or acquisition repetitions of an imaging sequence, acquiring magnetic resonance signals by at least one receiver, exciting spins in a part of the object, acquiring MR signals during application of the position-dependent field patterns, deriving a magnetic resonance image is from the sampled magnetic resonance signals, controlling at least N−1 field patterns independently in their field strength.

9. A computer program product as claimed in claim 8, additionally acquiring the magnetic resonance signals in a sub-sampling fashion and deriving the magnetic resonance image from the sub-sampled magnetic resonance signals.

10. A magnetic resonance imaging apparatus comprising:
a main magnet which generates a main magnetic field through an examination region;
a gradient coil system which applies non-linear magnetic field gradients across the examination region along each of a plurality of preselected axes;
a radio frequency system which excites and manipulates magnetic resonance spins in a part of an object in the examination region;
a receiver which receives magnetic resonance signals from the excited magnetic resonance spins in the examination region;
a reconstruction processor which reconstructs the received magnetic resonance signals into image representations;
a controller which controls the gradient field system to apply the non-linear magnetic field gradients along at least one of the axes with a plurality of different spatial position-dependent field patterns.

11. The apparatus according to claim 10, wherein the controller controls the gradient field system to generate the non-linear magnetic field gradients with a plurality of different position-dependent field patterns along each of the axes.

12. The apparatus according to claim 10, wherein the position dependent field patterns oscillate such that there are non-unique position dependencies, the different field patterns having different position-dependencies whereby the different position dependent field patterns have differing non-unique positions.

13. The apparatus according to claim 10, wherein the controller controls the RF system, the gradient system, and the receiver system to implement an undersampled imaging technique and wherein the reconstruction processor further includes a routine for unfolding folded image representations generated from undersampled received resonance signals.

14. The apparatus according to claim 13, wherein the undersampled imaging technique includes SENSE.

15. The apparatus according to claim 10 wherein the gradient coil system includes N independently controllable gradient coil subsystems for generating magnetic field gradients along the preselected axes, N being greater than the number of preselected axes.

16. The apparatus according to claim 15, wherein there are 3 preselected axes, at least one gradient coil subsystem generates magnetic field gradients along a first of the axes, at least one gradient coil subsystem generates magnetic field gradients along a second of the axes, ad at least two of the independently controllable gradient coil subsystems generate magnetic field gradient components along a third of the 3 axes.

* * * * *